United States Patent
Shimizu et al.

(10) Patent No.: US 9,880,600 B2
(45) Date of Patent: Jan. 30, 2018

(54) STAND-BY POWER ESTIMATING APPARATUS AND PROGRAM

(71) Applicant: Panasonic Intellectual Property Management Co., Ltd., Osaka (JP)

(72) Inventors: Noriyoshi Shimizu, Osaka (JP); Takashi Nishiyama, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 170 days.

(21) Appl. No.: 14/429,106

(22) PCT Filed: Aug. 29, 2013

(86) PCT No.: PCT/JP2013/005111
§ 371 (c)(1),
(2) Date: Mar. 18, 2015

(87) PCT Pub. No.: WO2014/061187
PCT Pub. Date: Apr. 24, 2014

(65) Prior Publication Data
US 2015/0248153 A1 Sep. 3, 2015

(30) Foreign Application Priority Data

Oct. 19, 2012 (JP) ................................ 2012-232374
May 21, 2013 (JP) ................................ 2013-107406

(51) Int. Cl.
*G06F 11/30* (2006.01)
*G06F 1/28* (2006.01)
(Continued)

(52) U.S. Cl.
CPC ............... *G06F 1/28* (2013.01); *G01R 21/00* (2013.01); *G01R 22/00* (2013.01);
(Continued)

(58) Field of Classification Search
CPC ...... G01R 21/00; G01R 22/00; G06F 11/3024; G06F 11/3055; G06F 1/28; H02J 13/00;
(Continued)

(56) References Cited

U.S. PATENT DOCUMENTS

2011/0010106 A1   1/2011   Katsukura et al.

FOREIGN PATENT DOCUMENTS

JP   2003-259569 A   9/2003
JP   2007-259647 A   10/2007
(Continued)

OTHER PUBLICATIONS

Extended European Search Report dated Nov. 5, 2015 for corresponding European Application No. 13847010.9.
(Continued)

*Primary Examiner* — Abdelmoniem Elamin
(74) *Attorney, Agent, or Firm* — Renner, Otto, Boisselle & Sklar, LLP

(57) ABSTRACT

An estimating apparatus includes an acquiring unit, a history recording unit, and a determining unit. The acquiring unit acquires power amounts for respective measurement times from a measuring apparatus that measures power for each branch line, as a plurality of used power amounts. The history recording unit records the plurality of used power amounts in association with dates and times. The determining unit variably sets a comparison value for comparing magnitudes of the plurality of used power amounts recorded in the history recording unit, obtains a minimum value of the comparison value in a range satisfying a condition that an amount of time for which at least some of the plurality of used power amounts are continuously equal to or below the comparison value exceeds a prescribed sustained time, and estimates the minimum value to be a peak value of stand-by power of the branch line.

20 Claims, 8 Drawing Sheets

(51) Int. Cl.
*H02J 9/00* (2006.01)
*G01R 21/00* (2006.01)
*G01R 22/00* (2006.01)
*H02J 13/00* (2006.01)
*H02J 3/14* (2006.01)

(52) U.S. Cl.
CPC ...... *G06F 11/3024* (2013.01); *G06F 11/3055* (2013.01); *H02J 9/005* (2013.01); *H02J 13/00* (2013.01); *H02J 2003/143* (2013.01); *Y02B 70/3233* (2013.01); *Y02B 70/3266* (2013.01); *Y04S 20/225* (2013.01); *Y04S 20/242* (2013.01)

(58) Field of Classification Search
CPC . H02J 2003/143; H02J 9/005; Y02B 70/3233; Y02B 70/3266; Y04S 20/225; Y04S 20/242
See application file for complete search history.

(56) References Cited

FOREIGN PATENT DOCUMENTS

| | | |
|---|---|---|
| JP | 2008-089431 A | 4/2008 |
| JP | 2011-130535 A | 6/2011 |
| JP | 2011-242927 A | 12/2011 |
| JP | 2012-019579 A | 1/2012 |
| JP | 2012-168018 A | 9/2012 |
| JP | 2012-170230 A | 9/2012 |
| KR | 10-2012-0111210 A | 10/2012 |
| WO | WO 2009/125659 A1 | 10/2009 |

OTHER PUBLICATIONS

International Search Report for corresponding International Application No. PCT/JP2013/005111 dated Nov. 19, 2013.
Form PCT/ISA/237 for corresponding International Application No. PCT/JP2013/005111 dated Nov. 19, 2013.

FIG. 4A

| NAME | USED POWER AMOUNT [W] | NAME | USED POWER AMOUNT [W] |
|---|---|---|---|
| AIR CONDITIONER IN LIVING ROOM | 1200 | FIRST WESTERN STYLE ROOM | 100 |
| AIR CONDITIONER IN BEDROOM | 800 | HALLWAY | 10 |
| LIVING ROOM | 160 | SECOND WESTERN STYLE ROOM | 30 |
| KITCHEN | 90 | WASHROOM | 0 |

FIG. 4B

| NAME | USED POWER AMOUNT [W] | POWER THRESHOLD [W] | DIFFERENCE [W] |
|---|---|---|---|
| AIR CONDITIONER IN LIVING ROOM | 1200 | 0 | 1200 |
| AIR CONDITIONER IN BEDROOM | 800 | 0 | 800 |
| LIVING ROOM | 160 | 60 | 100 |
| KITCHEN | 90 | 30 | 60 |
| FIRST WESTERN STYLE ROOM | 100 | 50 | 50 |
| HALLWAY | 10 | 0 | 10 |
| SECOND WESTERN STYLE ROOM | 30 | 30 | 0 |
| WASHROOM | 0 | 0 | 0 |

FIG. 4C

| NAME | USED POWER AMOUNT [W] | NAME | USED POWER AMOUNT [W] |
|---|---|---|---|
| AIR CONDITIONER IN LIVING ROOM | 1200 | FIRST WESTERN STYLE ROOM | 100 |
| AIR CONDITIONER IN BEDROOM | 800 | HALLWAY | 10 |
| LIVING ROOM | 160 | SECOND WESTERN STYLE ROOM | 30 |
| KITCHEN | 90 | WASHROOM | 0 |

| NAME | USED POWER AMOUNT [W] | NAME | USED POWER AMOUNT [W] |
|---|---|---|---|
| AIR CONDITIONER IN LIVING ROOM | 1200 | FIRST WESTERN STYLE ROOM | 100 |
| AIR CONDITIONER IN BEDROOM | 800 | HALLWAY | 10 |
| LIVING ROOM | 160 | | |
| KITCHEN | 90 | | |

| | | | |
|---|---|---|---|
| AIR CONDITIONER IN LIVING ROOM | 1200w | FIRST WESTERN STYLE ROOM | 100w |
| AIR CONDITIONER IN BEDROOM | 800w | HALLWAY | 10w |
| LIVING ROOM | 160w | | |
| KITCHEN | 90w | | |

| | | | |
|---|---|---|---|
| AIR CONDITIONER IN LIVING ROOM | 1200w | WASHING MACHINE | 100w |
| AIR CONDITIONER IN BEDROOM | 800w | REFRIGERATOR | 10w |
| LIVING ROOM | 160w | | |
| KITCHEN | 90w | | |

STAND-BY POWER ESTIMATING APPARATUS AND PROGRAM

TECHNICAL FIELD

The present invention relates to a stand-by power estimating apparatus that estimates stand-by power of an electrical load, and a program that causes a computer to function as the stand-by power estimating apparatus.

BACKGROUND ART

In recent years, there has been an increase in electrical loads that consume a small amount of power even when not in use. Specifically, stand-by power occurs in various electrical loads including electrical loads that await wireless signals such as imaging equipment and lighting fixtures, electrical loads that stand by for signal reception or perform signal transmission when unused such as communication devices, and electrical loads that run an internal clock when unused. In addition, some electrical loads such as television receivers and personal computers enable operating modes such as a stand-by mode and a power saving mode to be selected. In these operating modes, electrical loads enter an unused state without having their power turned off. Such operating modes also generate stand-by power. Therefore, in order to discriminate between a used state and an unused state of an electrical load by monitoring power, a magnitude of stand-by power must be known.

Stand-by power differs according to a type of an electrical load used by a power consumer and also differs according to a segment (measurement object, area) of a power distribution network in which power is to be measured. In this case, a segment of a power distribution network refers to a main circuit among a power distribution network of a consumer, a branch circuit among the power distribution network of the consumer, a room used by the consumer, an individual electrical load used by the consumer, or the like. Adopting a main circuit as a segment means that a sum of power used by all electrical loads used by the consumer is to be measured, while adopting each of a plurality of branch circuits as a segment means that a sum of power used by electrical loads connected to each branch circuit is to be measured.

As described earlier, stand-by power of an electrical load must be obtained in advance in order to discriminate between a used state and an unused state of the electrical load. For example, techniques are proposed in which a histogram of power values is created from, for example, a record of power values of the previous day, whereby a power value which is on a right side of a peak of frequency and whose frequency equals 0 or represents a local minimum value is adopted as stand-by power (for example, refer to paragraphs [0135] and [0136] in JP 2012-168018 A (hereinafter, referred to as "Document 1")).

With the technique described in Document 1, since stand-by power is obtained using a shape of a peak of frequency in a histogram, information regarding time is not retained. Therefore, stand-by power cannot be accurately obtained when, for example, stand-by power fluctuates from one time slot to the next.

SUMMARY OF INVENTION

An object of the present invention is to provide a stand-by power estimating apparatus capable of accurately obtaining stand-by power even when stand-by power fluctuates according to time slots and to provide a program that enables a computer to function as the stand-by power estimating apparatus.

A stand-by power estimating apparatus according to the present invention includes: an acquiring unit configured to acquire power amounts for respective prescribed measurement times from a measuring apparatus that measures power of at least one segment set in a power distribution network of a power consumer, as a plurality of used power amounts; a history recording unit configured to record each of the plurality of used power amounts of the at least one segment in association with a date and time of acquisition by the acquiring unit; and a determining unit which has a function for variably setting a comparison value for comparing magnitudes of the plurality of used power amounts recorded in the history recording unit, a function for obtaining a minimum value of the comparison value in, within a range in which the comparison value is variable, a range satisfying a condition that an amount of time for which, in a state where the plurality of used power amounts are arranged in order of the measurement times, at least some of the plurality of used power amounts are continuously equal to or below the comparison value exceeds a prescribed sustained time, and a function for estimating the minimum value to be a peak value of stand-by power of the at least one segment.

Moreover, the stand-by power estimating apparatus obtains a peak value of the stand-by power by including, in the stand-by power, a used power amount created by electrical loads such as a refrigerator which are basically never turned off and which constantly consume power.

In the stand-by power estimating apparatus, favorably, the determining unit further has: a function for obtaining a frequency distribution with respect to the plurality of used power amounts recorded in the history recording unit; a function for grouping a plurality of ranges having two or more consecutive sections in which the frequency exceeds a prescribed frequency threshold in the frequency distribution into a plurality of groups regarding the plurality of used power amounts; a function for selecting, as an initial value of the comparison value, a value satisfying the condition among values that are set based on a maximum value among the plurality of used power amounts obtained for each of the plurality of groups; and a function for monotonously varying the comparison value from the initial value to the maximum value in a group used to determine the initial value among the plurality of groups.

In the stand-by power estimating apparatus, favorably, the determining unit uses two or more used power amounts in a prescribed determination period among the plurality of used power amounts recorded in the history recording unit.

In the stand-by power estimating apparatus, favorably, the determining unit further has a function for setting a power threshold for discriminating an operational state of an electrical load included in the at least one segment of the power distribution network using the estimated peak value.

Favorably, the stand-by power estimating apparatus further includes a state discriminating unit configured to discriminate the operational state of the electrical load in the at least one segment of the power distribution network by comparing the plurality of used power amounts acquired by the acquiring unit from the measuring apparatus and the power threshold set by the determining unit.

In the stand-by power estimating apparatus, favorably, the state discriminating unit further has a function for measuring an amount of time for which a use state of the electrical load in the at least one segment continues, and estimating that a failure to turn off the electrical load has occurred in the at least one segment when the amount of time reaches a prescribed time threshold.

Favorably, the stand-by power estimating apparatus further includes a presentation control unit configured to notify an information presenting apparatus of a discrimination result obtained by the state discriminating unit.

In the stand-by power estimating apparatus, more favorably, the information presenting apparatus is a mobile terminal used by a user belonging to the consumer, and when the state discriminating unit discriminates that the electrical load in the at least one segment in the power distribution network is in a used state, the presentation control unit is configured to notify the information presenting apparatus of the discrimination result.

In the stand-by power estimating apparatus, more favorably, the presentation control unit has a function for selecting a format in which the discrimination result obtained by the state discriminating unit is presented to the information presenting apparatus from a plurality of formats.

Favorably, the stand-by power estimating apparatus further includes an operation control unit configured to control the electrical load to an unused state, and the information presenting apparatus includes an operating unit for issuing an instruction to the operation control unit to cause a transition of the electrical load discriminated to be in a used state by the state discriminating unit, to the unused state.

Favorably, the stand-by power estimating apparatus further includes an avoiding unit configured to prevent the instruction to cause the transition to the unused state to be issued from the operating unit to the operation control unit with respect to the electrical load which is discriminated to be in the used state by the state discriminating unit and which is prohibited from making the transition to the unused state.

More favorably, the stand-by power estimating apparatus further includes a presentation control unit configured to notify an information presenting apparatus that is a mobile terminal used by a user belonging to the consumer, of a discrimination result obtained by the state discriminating unit, and when the state discriminating unit estimates that the failure to turn off the electrical load has occurred in the at least one segment in the power distribution network, the presentation control unit is configured to notify the information presenting apparatus of this estimation result.

Favorably, the stand-by power estimating apparatus further includes a result storing unit configured to store a history of results obtained by the determining unit.

In the stand-by power estimating apparatus, favorably, the at least one segment includes a plurality of segments set in the power distribution network, the acquiring unit is configured to acquire the plurality of used power amounts from the measuring apparatus for each of the plurality of segments, the history recording unit is configured to record each of the plurality of used power amounts in association with the date and time of acquisition by the acquiring unit, for each of the plurality of segments, and the determining unit is configured to obtain the minimum value for each of the plurality of segments and estimates the minimum value to be the peak value.

A program according to the present invention causes a computer to function as any one of the stand-by power estimating apparatuses described above. The present invention is not limited to a program and may instead be a computer-readable recording medium on which the program is recorded.

According to the present invention, since a configuration is adopted which uses a transition with time of a plurality of used power amounts that are power amounts for respective measurement times and, when at least some of the plurality of used power amounts are continuously maintained at a relatively low level, estimates a used power amount for the period to be a peak value of stand-by power, there is an advantage that stand-by power can be accurately obtained even when the stand-by power fluctuates according to time slots.

BRIEF DESCRIPTION OF DRAWINGS

Preferred embodiments of the present invention will now be described in greater detail. Other features and advantages of the present invention can be better understood with reference to the following detailed description taken in conjunction with the accompanying drawings, in which:

FIGS. 4A to 4C are diagrams showing an operation example of the stand-by power estimating apparatus according to the embodiment;

DESCRIPTION OF EMBODIMENTS

In the stand-by power estimating apparatus described below, each of a plurality of branch lines that branch off of a trunk line (a line passing through a main breaker) on a distribution panel installed at a consumer is assumed to constitute a segment of a power distribution network, whereby power is acquired for each branch line. However, the segment (measurement object, area) of the power distribution network can be set in various ways as necessary including the trunk line, lines that further branch off of the branch lines, outlets connected to the branch lines, and electrical loads connected to the branch lines.

Figure 1:
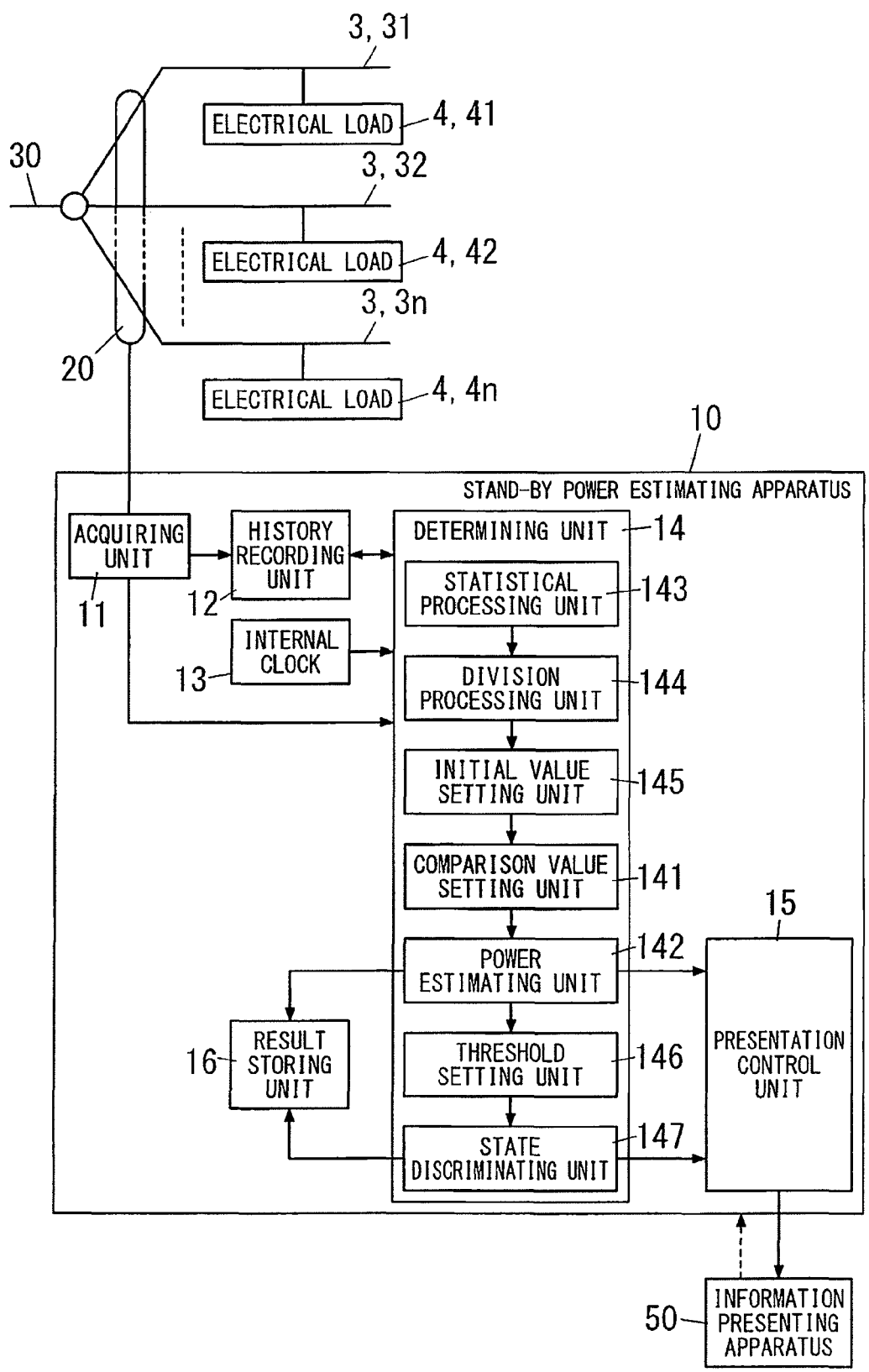
FIG. 1 is a block diagram showing a stand-by power estimating apparatus according to an embodiment.

As shown in FIG. 1, a trunk line 30 of the consumer branches off to a plurality of branch lines 31, 32, . . . on a distribution panel (not shown). The branch lines 31, 32, . . . respectively form lines that supply power in room units, lines that exclusively supply power to one electrical load 4, lines that supply power to a plurality of electrical loads 4 of a same type, and the like. In the following description, the branch lines 31, 32, . . . will be referred to as the branch line 3 if the branch lines need not be distinguished from one another, and electrical loads 41, 42, . . . will be referred to as the electrical load 4 if the electrical loads need not be distinguished from one another.

A measuring apparatus 20 that measures power for each branch line 3 is arranged inside or in the vicinity of the distribution panel. For example, the measuring apparatus 20 includes a measuring unit (not shown) which measures current and voltage for each branch line 3 and a calculating unit (not shown) which calculates power based on the current and voltage measured by the measuring unit. The measuring unit samples current and voltage. The calculating unit obtains power as instantaneous power for each sampling period. Hereinafter, when the measuring apparatus 20 is to measure power of the branch line 3 in room units, the electrical load 4 will refer to all electrical loads connected to a corresponding branch line 3 in a corresponding room.

The measuring apparatus 20 delivers (outputs) a power amount for each prescribed measurement time to the stand-by power estimating apparatus 10 as a used power amount. The stand-by power estimating apparatus 10 includes an acquiring unit 11 which acquires the used power amount from the measuring apparatus 20. The acquiring unit 11 has a function for communicating with the measuring apparatus 20 through a wired or wireless transmission path. The measurement time is selected from, for example, 30 seconds, 1 minute, 2 minutes, and 5 minutes. Favorably, 1 minute is selected as the measurement time. A used power amount that is an aggregate value of instantaneous power is calculated by the measuring apparatus 20 and delivered to the acquiring unit 11.

A used power amount according to the present embodiment represents power usage (electricity usage) on a branch line 3 as a segment and is, for example, an aggregate value of instantaneous power in a measurement time or average power obtained by dividing the aggregate value by the measurement time (an average value of power over the measurement time).

Moreover, when communication is not performed between the measuring apparatus 20 and the stand-by power estimating apparatus 10 and output of the measuring apparatus 20 is to be directly received by the stand-by power estimating apparatus 10, instantaneous power may be extracted (output) from the measuring apparatus 20 to the stand-by power estimating apparatus 10 and used power amount may be calculated by the stand-by power estimating apparatus 10.

The stand-by power estimating apparatus 10 is configured using, as a main hardware element, a device that realizes the functions described below when a program is executed. A representative example of a device of this type is a microcomputer including a processor and a memory. However, the processor and the memory constituting the computer may be individual devices. In addition, a device of this type may be a DSP (Digital Signal Processor) or an FPGA (Field-Programmable Gate Array). Furthermore, a program may be provided which causes a personal computer to function as the stand-by power estimating apparatus 10 described below. The program may be provided through an electric communication line such as the Internet or provided in a computer-readable recording medium.

The stand-by power estimating apparatus 10 includes a history recording unit 12 which records each of a plurality of used power amounts in association with a date and time of acquisition thereof by the acquiring unit 11 for each branch line 3. The date and time recorded in the history recording unit 12 is measured by an internal clock 13 provided in the stand-by power estimating apparatus 10. A storage capacity of the history recording unit 12 is determined based on conditions such as a size of the power distribution network of the consumer, a segment of the power distribution network, and a period over which used power amounts are to be recorded. While the history recording unit 12 can be configured using a hardware element including a movable part such as a hard disk apparatus, a semiconductor memory without a movable part is favorably used from the perspective of durability.

The stand-by power estimating apparatus 10 includes a determining unit 14 which obtains stand-by power for each branch line 3. The determining unit 14 estimates stand-by power from a plurality of used power amounts recorded in the history recording unit 12 for each branch line 3. To this end, the determining unit 14 includes a comparison value setting unit 141 which sets a comparison value for comparing magnitudes of the plurality of used power amounts and a power estimating unit 142 which obtains a minimum comparison value in a range satisfying a condition described below. The condition is that an amount of time for which at least some of the plurality of used power amounts are continuously equal to or below the comparison value exceeds a prescribed sustained time. The comparison value setting unit 141 sets the comparison value so as to be variable and the power estimating unit 142 obtains a minimum value of the comparison value by varying the comparison value in a range satisfying the sustained time for each branch line 3. For each branch line 3, the minimum value extracted by the power estimating unit 142 is estimated to be a peak value of stand-by power.

Stand-by power according to the present embodiment represents power usage (electricity usage) when standing by and is, for example, an aggregate value of instantaneous power when standing by (power amount during stand by) in a measurement time or a value obtained by dividing the aggregate value by the measurement time (power during stand by).

Moreover, the determining unit 14 obtains a peak value of the stand-by power by including, in the stand-by power, a used power amount created by electrical loads 4 such as a refrigerator which are basically never turned off and which constantly consume power.

Figure 2A:
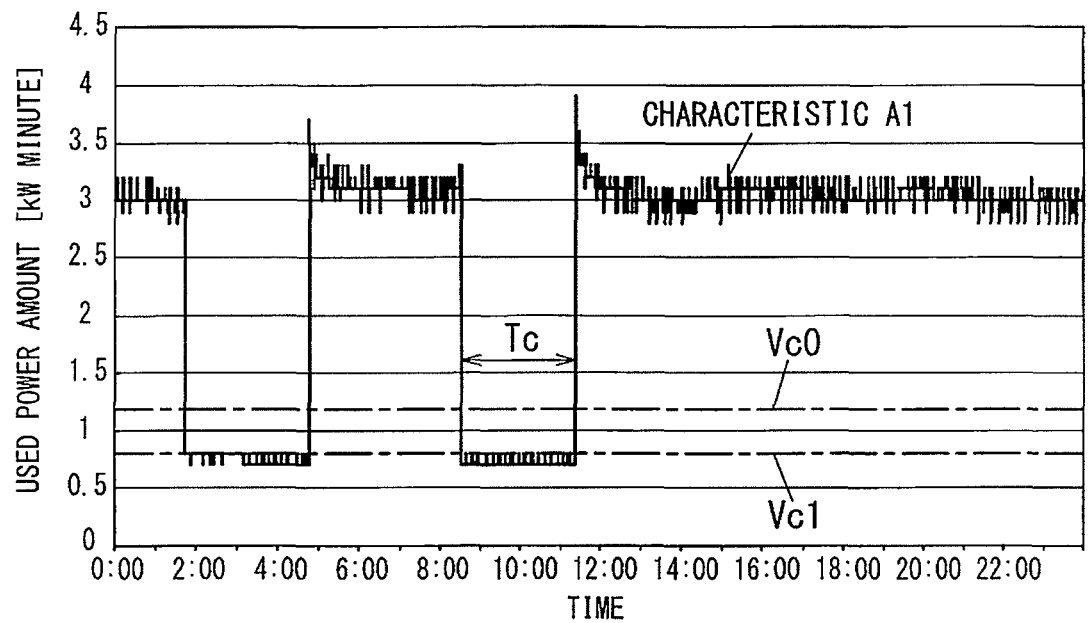
FIGS. 2A and 2B are diagrams showing an example of a history of used power amounts in the stand-by power estimating apparatus according to the embodiment.

Operations of the determining unit 14 will now be described with reference to FIGS. 2A and 2B. FIG. 2A shows an example of a transition of used power amounts in a branch line 3 corresponding to a bedroom and FIG. 2B shows an example of a transition of used power amounts in a branch line 3 corresponding to a kitchen.

Figure 2B:
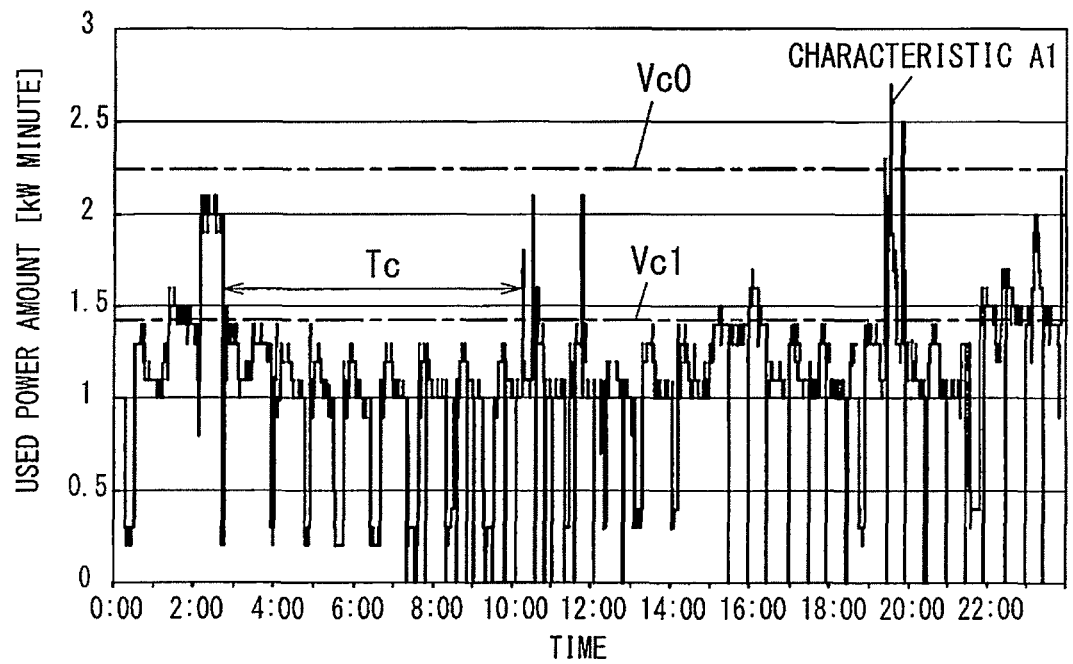

A characteristic A1 shown in FIGS. 2A and 2B represents a history of a plurality of used power amounts recorded in the history recording unit 12 and fluctuates significantly with the lapse of time. Among the characteristic A1, it is estimated that a portion with relatively high used power amounts represents the electrical load 4 in use and that a portion with relatively low used power amounts represents the electrical load 4 not in use. However, when a plurality of electrical loads 4 are connected to the branch line 3 or an electrical load 4 that enables a plurality of operating modes to be selected is connected to the branch line 3, it is possible that an electrical load 4 is in use even though the used power amount is relatively low.

On the other hand, with the exception of electrical loads 4 that constantly consume power such as a refrigerator, general electrical loads 4 can be separated into a used period and an unused period. For example, many electrical loads 4 used for business and commercial purposes are used during time slots in which business or commercial activities are being carried out. In addition, many electrical loads 4 used in a residence often remain unused for most of the day and are only temporarily used during specific time slots. Furthermore, electrical loads 4 that are likely to be used for a relatively long time such as an air conditioner are also present in a residence, and when such electrical loads 4 are in use, the used power amount fluctuates relatively widely. In other words, electrical loads 4 of this type run so as to repeat a period with a high used power amount and a period with a low used power amount during use.

According to the findings described above, with the exception of electrical loads 4 that constantly consume power, an operational state (a used state or an unused state) of electrical loads 4 can be discriminated by evaluating a length of a period in which the used power amount is relatively low.

Therefore, in consideration of a fluctuation in the used power amount of the electrical load 4, an appropriate sustained time is determined in consideration of an amount of time for which an unused state of the electrical load 4 continues and an amount of time for which the used power amount declines in a used state of the electrical load 4. When a period in which the used power amount is equal to or lower than a comparison value $Vc$ continues beyond the sustained time in each of the plurality of segments (the branch lines 3) set in the power distribution network, the power estimating unit 142 assumes the used power amount of the branch line 3 to be a stand-by power candidate.

The comparison value setting unit 141 sets a relatively large initial value $Vc0$ and lowers the comparison value $Vc$ in stages from the initial value $Vc0$ in a range where an amount of time $Tc$ for which the used power amount is continuously equal to or below the comparison value $Vc$ exceeds a sustained time $T1$ according to the power estimating unit 142. One stage in which the comparison value $Vc$ is varied is dependent on a resolution of the measuring apparatus 20 with respect to measuring a used power amount. Therefore, one stage of the comparison value $Vc$ is set to, for example, 1 watt-minute (W minute). In addition, while the sustained time $T1$ depends on use results of the electrical load 4 connected to the branch line 3, the sustained time $T1$ is set to, for example, 30 minutes or 1 hour.

When the comparison value $Vc$ is lowered in stages from the initial value $Vc0$, eventually, the amount of time $Tc$ for which the used power amount is continuously equal to or below the comparison value $Vc$ becomes equal to or shorter than the sustained time $T1$. At this point, the power estimating unit 142 obtains a minimum value $Vc1$ of the comparison value $Vc$ in a range in which the condition that the amount of time $Tc$ exceeds the sustained time $T1$ is satisfied. Since the minimum value $Vc1$ of the comparison value $Vc$ obtained in this manner has an error with respect to a peak value of stand-by power that is within a range of one stage of the comparison value $Vc$, the minimum value $Vc1$ is assumed to be a peak value of stand-by power.

Moreover, while the initial value $Vc0$ of the comparison value $Vc$ is set to a relatively large value so as to exceed a peak value of stand-by power in the operation example described above, alternatively, the initial value $Vc0$ of the comparison value $Vc$ may be set to a relatively small value so as to be smaller than the peak value of stand-by power. In this case, the comparison value setting unit 141 increases the comparison value $Vc0$ in stages and obtains a minimum value $Vc1$ of the comparison value $Vc$ in a range in which the condition that the amount of time $Tc$ exceeds the sustained time $T1$ is satisfied.

In addition, while the comparison value $Vc$ is monotonously varied from one initial value $Vc0$ in the operation described above, for example, by repeating the following procedure instead of monotonously varying the comparison value $Vc$, estimation of a peak value of stand-by power can be made in a more expeditious manner. (1) Set an initial value that is larger than a peak value of stand-by power, and perform condition judgment by setting a value that is half of the initial value as the comparison value $Vc$. (2) If the condition is not satisfied, perform condition judgment by using an average value of the initial value and the comparison value $Vc$ used in the condition judgment of (1) as a next comparison value $Vc$. (3) If the condition is satisfied, perform condition judgment by setting a value that is half of the comparison value $Vc$ used in the condition judgment of (2) as a next comparison value $Vc$.

In this case, it is determined that the conditions are satisfied when an amount of time $Tc$ for which the used power amount is continuously equal to or below the comparison value $Vc$ exceeds the sustained time $T1$. By repeating steps (2) and (3) in a range of the resolution of the measuring apparatus 20, the comparison value $Vc$ converges. Using this procedure, it is expected that the number of processes until a peak value of stand-by power is obtained may be reduced in comparison to monotonously varying the comparison value $Vc$.

When there is a large difference between the initial value $Vc0$ of the comparison value $Vc$ and the eventually obtained peak value of stand-by power, a processing load on the determining unit 14 until the peak value of stand-by power is obtained increases and, consequently, a relatively large amount of time is required until a result is obtained. Therefore, in order to reduce the processing load on the determining unit 14, the initial value $Vc0$ is desirably determined according to the following procedure.

In order to set the initial value $Vc0$ of the comparison value $Vc$, the determining unit 14 uses a frequency distribution of used power amounts obtained from a history of the used power amounts recorded in the history recording unit 12. To this end, the determining unit 14 includes a statistical processing unit 143 which obtains a frequency distribution of used power amounts, a division processing unit 144 which divides sections of the used power amounts into a plurality of groups based on the frequency distribution, and an initial value setting unit 145 which determines the initial value $Vc0$ from the plurality of divided groups.

Figure 3A:
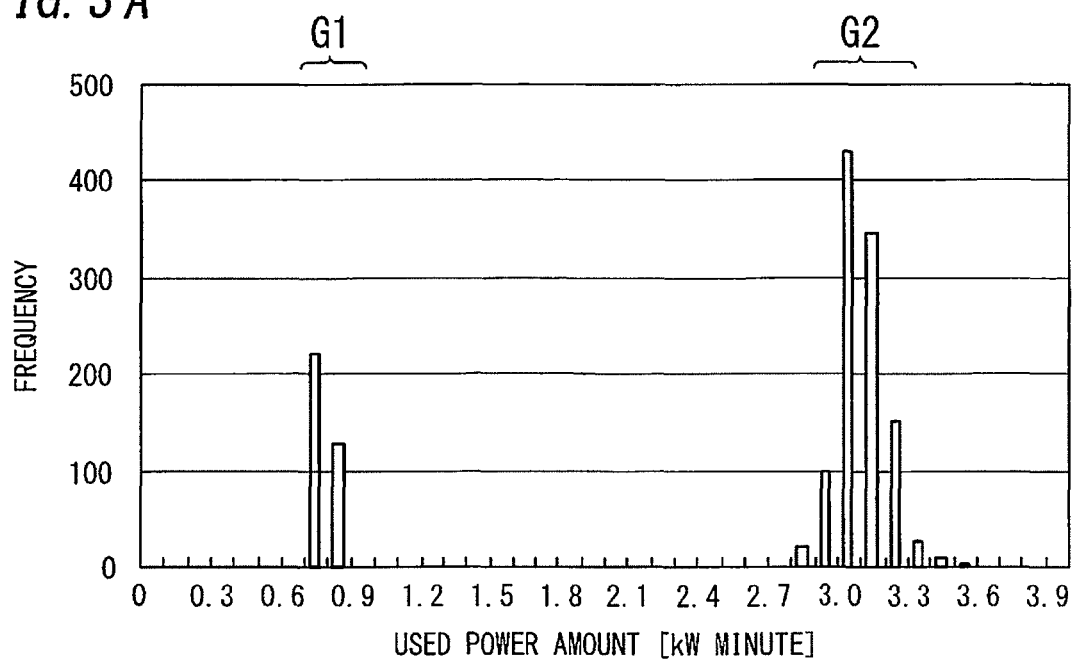
FIGS. 3A and 3B are diagrams showing an example of a frequency distribution of used power amounts in the stand-by power estimating apparatus according to the embodiment.
Figure 3B:
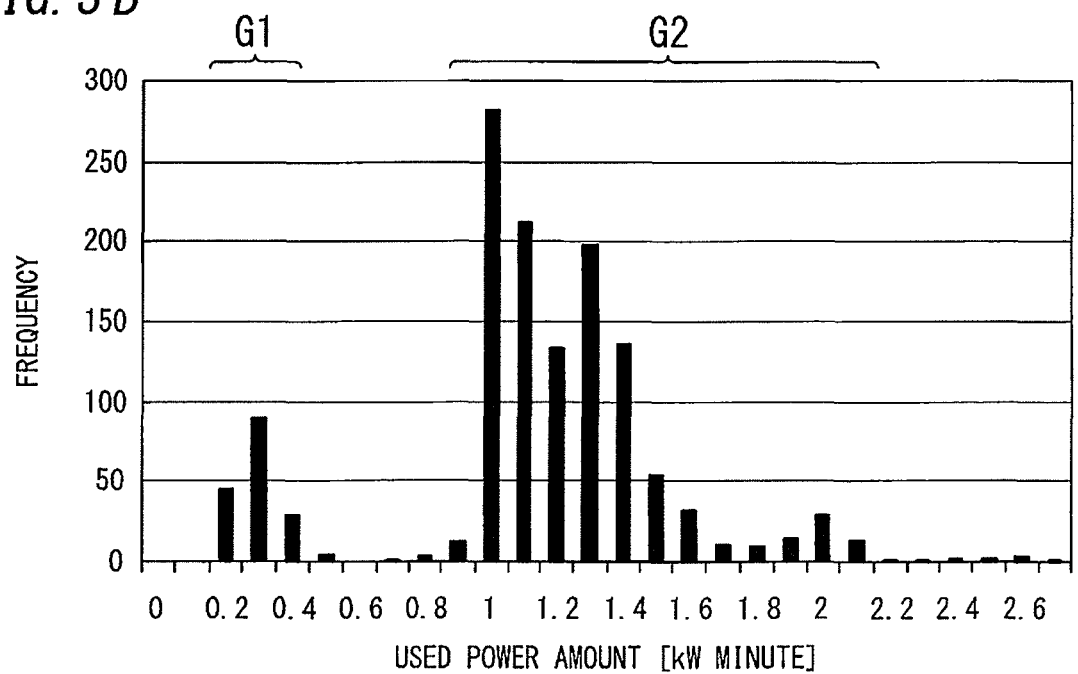

Based on a history of used power amounts for each segment in the power distribution network recorded in the history recording unit 12, as shown in FIGS. 3A and 3B, the statistical processing unit 143 appropriately sets a section regarding the used power amounts and generates a frequency distribution of used power amounts for each segment in the power distribution network. If the period over which the used power amounts had been collected is appropriate, the generated frequency distribution is expected to include one or more peaks (local maximum values). A typical shape of a frequency distribution includes two peaks.

A frequency distribution having this shape is generally interpreted such that a peak on a right side of FIGS. 3A and 3B (higher used power amounts) correspond to a used state of the electrical load 4 and a peak on a left side of FIGS. 3A and 3B (lower used power amounts) correspond to an unused state of the electrical load 4. Moreover, depending on the type of the electrical loads 4 connected to the branch line 3, stand-by power may not be created and a frequency in a section with a used power amount of 0 may constitute a peak. In this case, frequencies in sections with a used power amount of 0 are to be excluded.

The peak on the left side does not necessarily represent an unused state of the electrical load 4. For example, when an electrical load 4 capable of operating at a used power amount in the vicinity of the peak on the left side is connected to the branch line 3, the used power amount in the vicinity of the peak on the left side may potentially include a used state of the electrical load 4. In other words, when a plurality of electrical loads 41 are connected to a branch line 31, used power amounts of a used state and used power amounts of an unused state may coexist in the vicinity of the peak on the left side. When used power amounts of a used state and an unused state coexist in the vicinity of a same peak, a distinction between a used state and an unused state cannot be made based on the frequency distribution.

In the example shown in FIGS. 3A and 3B, two peaks are created in a frequency distribution (histogram). Therefore, the division processing unit 144 assumes each range having a plurality of consecutive sections in which frequency exceeds a prescribed frequency threshold to be a group regarding used power amounts. Moreover, the division of used power amounts into groups by the division processing unit 144 is not essential and used power amounts of all periods may be handled as one group. While the frequency threshold is desirably set to a value that is small as possible if not set to 0, the frequency threshold is set in consideration of amounts of time for which a used state and an unused state of the electrical load 4 continue for the purpose of reducing noise. As an example, the frequency threshold may be set to a range around 10 or lower (in other words, 10 minutes or less if a used power amount represents a power amount per minute).

The division processing unit 144 has a function for obtaining sections in the frequency distribution in which frequency exceeds the frequency threshold and, when a number of a plurality of adjacent sections exceeds the frequency threshold, collectively handling the sections as a same group. In other words, the division processing unit 144 has a function for assuming each range having a plurality of consecutive sections in which frequency exceeds the prescribed frequency threshold in the frequency distribution to be a group regarding used power amounts. In the example shown in FIGS. 3A and 3B, used power amounts are divided into two groups G1 and G2: the group G1 corresponding to the peak on the left side and the group G2 corresponding to the peak on the right side.

When the division processing unit 144 divides the plurality of used power amounts into the groups G1 and G2, the initial value setting unit 145 obtains a maximum value of the used power amounts in each of the obtained groups G1 and G2. In addition, using the obtained maximum values as a reference, the initial value setting unit 145 sets a value having a prescribed difference from the maximum value as an initial value for each of the groups G1 and G2. In the illustrated example, two values are obtained by determining initial values according to the method described above for the two divided groups G1 and G2. The smaller of the two values is selected as the initial value. On the other hand, when the amount of time Tc is equal to or shorter than the sustained time T1 at the selected initial value, the larger of the two values is selected as the initial value. Moreover, the initial value may be either larger or smaller than the maximum value of used power amounts of each of the groups G1 and G2. A difference between the maximum value of used power amounts of each of the groups G1 and G2 and the initial value may be around 10 to 100 times the resolution of the measuring apparatus 20.

Specific examples of selecting an initial value will now be described with reference to FIGS. 2A, 2B, 3A, and 3B. With a used power amount in a bedroom, for example, a transition occurs as shown in FIG. 2A and has a frequency distribution shown in FIG. 3A. In the illustrated example, used states and unused states of the electrical load 4 do not coexist as in the case of FIG. 2A and used power amounts are distinctly separated into a used state and an unused state. Therefore, the initial value setting unit 145 selects the initial value set using a maximum value of used power amounts in the group G1 that is the smaller of the two groups G1 and G2.

Meanwhile, with a used power amount in a kitchen, for example, a transition occurs as shown in FIG. 2B and has a frequency distribution shown in FIG. 3B. In other words, as is apparent from FIG. 2B, used states and unused states of the electrical load 4 cannot be distinctly differentiated. This is because used power amounts in the kitchen include fluctuations that accompany operations of electrical loads 4 such as a refrigerator. Therefore, when a value obtained from the group G1 having the smallest used power amount is selected as the initial value of the comparison value, the condition that the amount of time Tc exceeds the sustained time T1 may not be satisfied. In such a case, the initial value setting unit 145 selects a value obtained from the group G2 having the next largest used power amount as the initial value of the comparison value.

The comparison value setting unit 141 causes the comparison value to monotonously vary from the initial value toward the maximum value of the used power amount in any of the groups G1 and G2 which had been used to determine the initial value. In other words, the comparison value setting unit 141 gradually reduces the comparison value when the initial value is set to a value greater than the maximum value and gradually increases the comparison value when the initial value is set to a value smaller than the maximum value.

While the operation example described above represents a case where two peaks are obtained in a frequency distribution, when three or more peaks are obtained in a frequency distribution, the initial value is selected according to the following procedure. Specifically, an initial value obtained from a group with a smallest used power amount is first selected, and when the amount of time Tc is equal to or shorter than the sustained time T1 at the selected initial value, an initial value obtained from a group with a next largest used power amount is selected.

While a target period over which the determining unit 14 obtains a peak value of stand-by power is not particularly determined in the operation described above, since stand-by power may fluctuate from one season to another and may also fluctuate due to a secular change to the electrical load 4, the processing of the determining unit 14 is desirably performed after setting the period.

The determining unit 14 sets, for example, a previous full day among the history of used power amounts recorded in the history recording unit 12 as a determination period and performs a process of obtaining a peak value of stand-by power during this determination period. In this case, the process of obtaining a peak value of stand-by power includes the process of setting a comparison value using a frequency distribution. Using the previous full day as the determination period enables a peak value of stand-by power to be obtained from latest information. Therefore, the effect of changes in stand-by power due to seasonal fluctuations and fluctuations due to a secular change to the electrical load 41 can be mitigated.

In addition, depending on the used state of the electrical load 4, the sustained time T1 or the stand-by power may fluctuate according to a time slot such as daytime and nighttime. Therefore, the sustained time T1 may be set for each time slot or the initial value Vc0 that is set when obtaining a peak value of stand-by power may be set for each time slot. In addition to the previous full day, a full weekday and a full non-weekday may be used or a plurality of days extracted for each season may be used. When using a plurality of determination periods, the sustained time T1 and the initial value Vc0 are desirably set for each determination period.

For example, when a plurality of electrical loads 4 are connected to a branch line 3, depending on a time slot or a season, the electrical loads 4 to be used may differ. Therefore, a peak value of stand-by power may fluctuate according to which electrical load 4 is used. Accordingly, when information related to types of electrical loads 4 that are used according to a time slot or a season is known, the sustained time T1 and the initial value Vc0 are desirably adjusted based on the information.

When a peak value of stand-by power is obtained for each segment (in other words, the branch line 3) of the power distribution network as described above, a power threshold for discriminating between a used state and an unused state of the electrical load 4 can be determined for each branch line 3. The determining unit 14 includes a threshold setting unit 146 which determines a power threshold using the peak value of stand-by power and a state discriminating unit 147 which discriminates between a used state and an unused state of the electrical load 4 when the used power amount exceeds the power threshold. The threshold setting unit 146 adopts a value obtained by adding a prescribed value as a margin to the peak value of stand-by power as the power threshold.

The state discriminating unit 147 compares the used power amount for each branch line 3 acquired by the acquiring unit 11 from the measuring apparatus 20 with the power threshold for each branch line 3 set by the threshold setting unit 146 for the same branch line 3. Therefore, the state discriminating unit 147 discriminates between a used state and an unused state of the electrical load 4 for each branch line 3. In this case, while a used power amount is a power amount measured for a measurement time, a power threshold is set with respect to instantaneous power. Accordingly, when comparing a used power amount with a power threshold, a value obtained by dividing the used power amount by a measurement time is actually compared with the power threshold. A value obtained by dividing the used power amount by a measurement time corresponds to an average value of power for the measurement time.

A power threshold according to the present embodiment is a threshold regarding power and is used for comparison with a used power amount. When a used power amount is an aggregate value of instantaneous power for a measurement time, a threshold of a power amount is set as the power threshold. When a used power amount is an average value of power for a measurement time, a threshold of power is set as the power threshold.

In addition to a function for discriminating between a used state and an unused state of the electrical load 4 for each branch line 3, the state discriminating unit 147 desirably has a function for estimating whether a failure to turn off the electrical load 4 has occurred for each branch line 3.

The state discriminating unit 147 desirably has a function for measuring an amount of time for which the electrical load 4 is in a used state using the internal clock 13 and estimating that a failure to turn off the electrical load 4 has occurred when the measured amount of time reaches a prescribed time threshold.

The time threshold is appropriately determined using a transition of the used power amount for each branch line 3 stored in the history recording unit 12 or using a sum of frequencies of a group representing a used state in the frequency distribution. When using a transition of the used power amount, an average value and a dispersion of amounts of time of the used state are obtained for each electrical load 4 in the determination period, whereby an amount of time obtained by adding 1 to 3 times the dispersion to the average value can be determined as the time threshold. Whichever information is to be used, since a guideline regarding an amount of time for which a normal used state of the electrical load 4 continues can be obtained, the time threshold can be determined based on the guideline regarding an amount of time for which the used state continues.

As described above, the stand-by power estimating apparatus 10 is provided in the form of the determining unit 14 with functions for estimating a peak value of stand-by power, discriminating between a used state and an unused state, and estimating whether a failure to turn off the electrical load 4 has occurred. Therefore, the stand-by power estimating apparatus 10 includes a presentation control unit 15 in order to notify a user of the peak value of stand-by power as estimated by the power estimating unit 142 or a result of a discrimination (in use/not in use, failure to turn off) made by the state discriminating unit 147. The presentation control unit 15 notifies a peak value of stand-by power outputted from the determining unit 14, a result of discrimination, and the like to the information presenting apparatus 50.

While the information presenting apparatus 50 may be attached to the stand-by power estimating apparatus 10, a mobile terminal (a so-called smart phone or a tablet terminal) is desirably used. In other words, by mounting an application program for realizing a function for communicating with the presentation control unit 15 on the mobile terminal, an operation display apparatus of the mobile terminal can be used as the information presenting apparatus 50.

When the state discriminating unit 147 discriminates that the electrical load 4 is in a used state in any of the branch lines 3, the discrimination result is notified to the information presenting apparatus 50 through the presentation control unit 15. For example, by notifying a used state of a specific electrical load 4 to the information presenting apparatus 50, the existence of the user of the electrical load 4 can be monitored.

In addition, when the state discriminating unit 147 estimates that a failure to turn off the electrical load 4 has occurred, the failure to turn off the electrical load 4 may be notified to the information presenting apparatus 50 through the presentation control unit 15. In this case, as long a user of the electrical load 4 carries a mobile terminal as the information presenting apparatus 50, the failure to turn off the electrical load 4 is to be notified regardless of whether the user is in the residence of the consumer or outside. If the user is at home, the electrical load 4 which the user had forgotten to turn off can be turned off. In addition, by providing the information presenting apparatus 50 with a function for turning off a target electrical load 4, the electrical load 4 which the user had forgotten to turn off can be remotely operated and turned off from an outing destination. This function will be described later.

A timing, at which the presentation control unit 15 notifies a failure to turn off the electrical load 4 to the information presenting apparatus 50 when the state discriminating unit 147 estimates that the failure to turn off the electrical load 4 has occurred, may be after a lapse of a prescribed amount of time from the estimation of the failure to turn off the electrical load 4. Alternatively, the state of the electrical load 4 may be notified by the stand-by power estimating apparatus 10 to the information presenting apparatus 50 when a request for a notification on whether the electrical load 4 is in a used state or an unused state is made by the information presenting apparatus 50 to the stand-by power estimating apparatus 10.

In other words, any of a push-type process in which a notification of a failure to turn off the electrical load 4 is automatically made from the stand-by power estimating apparatus 10 to the information presenting apparatus 50 and a pull-type process in which a request for a notification of a failure to turn off the electrical load 4 is made by the information presenting apparatus 50 to the stand-by power estimating apparatus 10 may be performed. In addition, push-type and pull-type processes may be performed in a mixed manner or push-type and pull-type processes may be performed distributed among the respective branch lines 3. When notifying a failure to turn off the electrical load 4, desirably, in addition to a notification for each branch line 3, the stand-by power estimating apparatus 10 obtains a logical sum of states of a failure to turn off the electrical load 4 of all branch lines 3 of the consumer, and if there is even one failure to turn off the electrical load 4 among the plurality of branch lines 3, the failure to turn off the electrical load 4 is notified to the information presenting apparatus 50 through the presentation control unit 15.

The presentation control unit 15 desirably has a function for selecting a format used to present a discrimination result obtained by the state discriminating unit 147 to the information presenting apparatus 50 from a plurality of formats. Hereinafter, examples of a format used to present a discrimination result obtained by the state discriminating unit 147 to the information presenting apparatus 50 will be described. The format to be presented to the information presenting apparatus 50 is selected by the presentation control unit 15. In other words, when a used state of the electrical load 4 is discriminated by the state discriminating unit 147, the presentation control unit 15 presents a discrimination result to the information presenting apparatus 50 in a selected format.

In this case, a configuration may be adopted in that the format selected by the presentation control unit 15 is determined by the presentation control unit 15 in advance or the presentation control unit 15 selects a format specified by the information presenting apparatus 50. Alternatively, a configuration may be adopted in which a format to be displayed on an operation display apparatus is selected by having the stand-by power estimating apparatus 10 transmit required information to the information presenting apparatus 50 and having the information presenting apparatus 50 process the information.

A format shown in FIG. 4A is a list in which names of electrical loads 4 and used power amounts (power amounts per measurement time) of the electrical loads 4 are associated with each other. Moreover, used power amounts are presented in [W] units in FIGS. 4A to 4C and 5 because values are used which result from dividing a used power amount obtained with respect to a measurement time by the measurement time. In the following description with reference to FIGS. 4A to 4C and 5, a used power amount is assumed to be a value obtained by dividing an aggregate value of instantaneous power in a measurement time by the measurement time (an average value of power over the measurement time).

In this list, electrical loads 4 are organized in a descending order of values obtained by subtracting a power threshold determined with respect to the electrical loads 4 from used power amounts. In other words, the presentation control unit 15 subtracts a power threshold for determining whether or not electrical loads 4 are in a used state from used power amounts and generates data of a list organized such that an electrical load 4 with a largest subtraction result is ranked first and an electrical load 4 with a smallest subtraction result is ranked last.

FIG. 4B shows a relationship among used power amounts, power thresholds, and results of subtraction of the power thresholds from the used power amounts with respect to the example shown in FIG. 4A. Between a "kitchen" and a "first western style room", while the "kitchen" has a lower used power amount, the "kitchen" has a lower power threshold. Therefore, the result of subtraction of the power threshold from the used power amount for the "kitchen" is larger. Therefore, in the list, the "kitchen" is ranked higher than the "first western style room".

Using the format described above enables the user to intuitively recognize an electrical load 4 that is in a used state (a branch line 3 to which an electrical load 4 in a used state is connected) due to forgetting to turn off the electrical load 4 or the like. In addition, the user can readily recognize which electrical load 4 is consuming more power.

In the format described above, by differentiating the display of items (name and used power amount) corresponding to an electrical load 4 that is in a used state (in other words, whose used power amount exceeds the power threshold), the user can recognize the electrical load 4 that is in a used state more intuitively.

For example, the presentation control unit 15 generates data for displaying respective items of a used state and an unused state in different colors as shown in FIG. 4C. In this case, red or the like is used for the items corresponding to a used state and green, black, or the like is used for the items corresponding to an unused state. In addition, for the respective items corresponding to a used state and an unused state, the presentation control unit 15 may generate data for inverted display with respect to one state and non-inverted display for the other state, data for flickering display with respect to one state and continuous display for the other state, data for applying hatching to only one state, or the like.

Figures 5, 6:
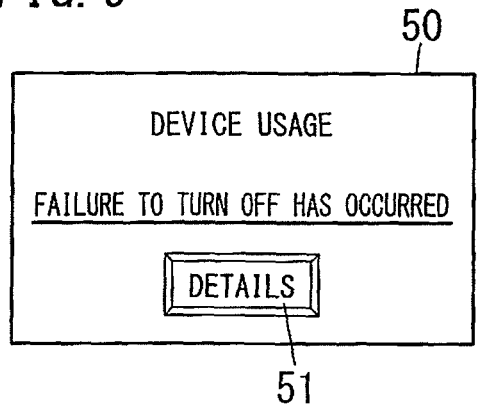
FIG. 5 is a diagram showing another operation example of the stand-by power estimating apparatus according to the embodiment.
FIG. 6 is a diagram showing yet another operation example of the stand-by power estimating apparatus according to the embodiment.

Furthermore, as shown in FIG. 5, the presentation control unit 15 may only display electrical loads 4 that are in a used state on the list and exclude electrical loads 4 that are in an unused state from the list. When only electrical loads 4 that are in a used state are displayed on the list, electrical loads 4 whose used power amount is equal to or below the power threshold and which only consume stand-by power are not displayed on the list. Therefore, the user can recognize the electrical loads 4 that are in a used state at a glance.

In the operation example described above, the presentation control unit 15 determines contents to be presented on the information presenting apparatus 50 based solely on a discrimination result of a used state and an unused state by the state discriminating unit 147. Meanwhile, there are electrical loads 4 that are intentionally placed in a continuous used state by the user for purposes of security, safety, and the like. When electrical loads 4 that are in a used state are displayed on the list, electrical loads 4 that are intentionally placed in a continuous used state by the user such as a gate light and an entrance light cannot be distinguished from electrical loads 4 that are in a continuous used state because the user had forgotten to turn off power.

Meanwhile, in cases where the user intentionally places electrical loads 4 in a continuous used state, a time slot in which the used state is to be continued may be determined. For example, when the electrical load 4 is a gate light or an entrance light, since the electrical load 4 need only be in a used state in a time slot from sunset to sunrise, the electrical load 4 is conceivably in an unused state from around 6 o'clock to 18 o'clock throughout the year. Therefore, the determining unit 14 may have a function for setting a time slot for an unused state for each electrical load 4.

With respect to electrical loads 4 for which a time slot for an unused state is set, the determining unit 14 determines that a failure to turn off power has occurred when the used power amount exceeds the power threshold only during the set time slot. In other words, since the electrical load 4 is scheduled to be in an unused state during the set time slot, the determining unit 14 determines that a failure to turn off power has occurred when the state discriminating unit 147 discriminates that the electrical load 4 is in a used state in the time slot. On the other hand, even if the state discriminating unit 147 discriminates that the electrical load 4 is in a used state, when the discriminated time is not included in the time slot, the electrical load 4 a is not handled as a failure to turn off power.

For example, as described above, when only electrical loads 4 corresponding to a failure to turn off power are included in the list, the electrical loads 4 for which a time slot in which the electrical loads 4 are in an unused state is set are only displayed when a time at which the state discriminating unit 147 makes a discrimination of a used state is included in the set time slot. In a case where an electrical load 4 is a gate light, an entrance light, or the like and a time slot of 6 o'clock to 18 o'clock is set, when a discrimination of a used state is made from 6 o'clock to 18 o'clock, the electrical load 4 is included in the list as a failure to turn off power. In addition, when a discrimination of a used state is made from 18 o'clock to 6 o'clock of the following day, since the electrical load 4 does not represent a failure to turn off power, the electrical load 4 is not included in the list.

Moreover, in addition to setting a time slot for a failure to turn off power, a time slot in which a used state is scheduled may be set. In addition, in a case of an electrical load 4 such as a gate light, an entrance light, or the like which is scheduled to be in a used state in a time slot from sunset to sunrise, a configuration may be adopted in which the determining unit 14 stores data regarding times of sunset and times of sunrise and the time slot is varied according to an applied date.

The state discriminating unit 147 need not constantly discriminate whether a failure to turn off power of the electrical loads 4 has occurred. For example, when a configuration is adopted in which an instruction is issued from the information presenting apparatus 50 to the determining unit 14, the state discriminating unit 147 may make a discrimination of a failure to turn off power only when an instruction is issued by the information presenting apparatus 50.

Let us assume that the electrical loads 4 are a gate light and an entrance light and a time slot for considering a failure to turn off power is set to 6 o'clock to 18 o'clock. On this assumption, when an inquiry is made before retiring for the night from the information presenting apparatus 50 to the stand-by power estimating apparatus 10 on whether or not a failure to turn off power has occurred, since the inquiry is made in a time slot in which a used state of the gate light and the entrance light is not considered as a failure to turn off power, a failure to turn off power is not determined and the gate light and the entrance light are not included in the list.

The format described so far solely uses a list that includes electrical loads 4 for which a failure to turn off power is determined. Therefore, a plurality of electrical loads 4 may potentially be displayed at once on an operation display apparatus of the information presenting apparatus 50. When such a list is abruptly displayed on the information presenting apparatus 50, the user may not be able to instantaneously comprehend what the display means.

In consideration thereof, when a discrimination result of the state discriminating unit 147 indicates a failure to turn off power, the presentation control unit 15 generates data for displaying an occurrence of a failure to turn off power and causes the operation display apparatus of the information presenting apparatus 50 to display information indicating a failure to turn off power as shown in FIG. 6. In addition, desirably, a "detail" button 51 as an operating unit is also displayed on a screen of the operation display apparatus, and when the "detail" button 51 is pressed (touched), a list showing used power amounts for each electrical load 4 is displayed on the information presenting apparatus 50.

The process of displaying information regarding a failure to turn off power and the "detail" button 51 on the information presenting apparatus 50 and the process of displaying a list on the information presenting apparatus 50 when the "detail" button 51 is pressed may be performed by the presentation control unit 15 by generating data. However, the process related to the "detail" button 51 may be performed by the information presenting apparatus 51 by receiving data for displaying the list from the presentation control unit 15.

By performing the processes described above, the user can recognize, at a glance, at which electrical load 4 of the consumer a failure to turn off power has occurred from the display on the information presenting apparatus 50. In addition, when a failure to turn off power has occurred, each electrical load 4 at which a failure to turn off power has occurred can be confirmed on the list.

In the process described above, a timing at which information related to a failure to turn off power is notified to the information presenting apparatus 50 is set to a time point of the state discriminating unit 147 making a discrimination of a failure to turn off power or a time point at which an inquiry is made from the information presenting apparatus 50 to the stand-by power estimating apparatus 10. On the other hand, generally, information related to a failure to turn off power may be notified immediately before the user becomes incapable of managing the electrical load 4. The user is incapable of managing the electrical load 4 mainly when outside or asleep. Therefore, when a time at which the user retires for the night or a time at which the use goes out is known, information related to a failure to turn off power is desirably notified around 10 minutes prior to these times.

For example, when the time at which the user retires for the night is 0 o'clock and the time at which the use goes out is 7:30, the presentation control unit 15 may receive discrimination results of the state discriminating unit 147 at 23:50 and 7:20, and when a failure to turn off power has occurred, the presentation control unit 15 may notify the failure to turn off power to the information presenting apparatus 50. In this manner, when a failure to turn off power has occurred, by notifying the failure to turn off power to the information presenting apparatus 50 around 10 minutes before retiring for the night or going out, the user can confirm and address the failure to turn off power with time to spare.

When the information presenting apparatus 50 includes an apparatus that outputs sound (a speaker and a circuit for driving the speaker) in addition to the operation display apparatus, the information presenting apparatus 50 may notify information regarding the failure to turn off power by sound. In other words, the presentation control unit 15 may generate data for reading out a list that includes only electrical loads 4 for which a failure to turn off power is determined as shown in FIG. 5 and transmit the data to the information presenting apparatus 50. For example, when failures to turn off power have occurred with respect to an air conditioner in the living room, which is an electrical load 4, and a first western style room, a message reading "You forgot to turn off power of the air conditioner in the living room and the first western style room" or the like may be output by the information presenting apparatus 50.

Instead of a configuration in which a used power amount of each electrical load 4 is shown on the information presenting apparatus 50 as in the case of the example described above, a sum of power amounts (including power) obtained by subtracting power thresholds from used power amounts may be divided into a plurality of levels for all electrical loads 4 of the consumer and the levels may be displayed. With this format, desirably, the presentation control unit 15 generates data for displaying an appropriate graphic on the information presenting apparatus 50 and varies a blinking cycle of the graphic or varies the color of the graphic according to the levels described above. For example, the presentation control unit 15 may generate data such that the greater the sum of power amounts, the shorter the blinking cycle. In addition, the presentation control unit 15 may divide the sum of power amounts into three levels, color the graphic red for a maximum sum, color the graphic green for a minimum sum, and color the graphic yellow when the sum is between the maximum and minimum sums. Moreover, the used power amount may be an aggregate value of instantaneous power over a measurement time or an average value of power over the measurement time. When a used power amount is an aggregate value of instantaneous power, a threshold of a power amount is set as the power threshold. On the other hand, when a used power amount is an average value of power for the measurement time, a threshold of power is set as the power threshold.

The various formats described above are selected as an instruction is issued from the operation display device provided in the information presenting apparatus 50 to the stand-by power estimating apparatus 10. Therefore, the user need only operate the information presenting apparatus 50 to select a desired format. In addition, the user can recognize data regarding failures to turn off power in a format of choice.

As described above, the stand-by power estimating apparatus 10 uses the determining unit 14 to estimate a peak value of stand-by power (a power amount during standby, power during stand by), discriminate between a used state and an unused state of an electrical load 4, and estimate whether a failure to turn off power of the electrical load 4 has occurred. In order to store results obtained by the determining unit 14 as described above, the stand-by power estimating apparatus 10 includes a result storing unit 16. The result storing unit 16 stores a history with respect to the peak value of stand-by power, a discrimination result between a used state and an unused state of the electrical load 4, and a failure to turn off power of the electrical load 4 as obtained by the determining unit 14.

Information stored in the result storing unit 16 is to be utilized at a later date to evaluate usage of electrical loads 4 and trends in failures to turn off power of the electrical loads 4 of the consumer.

Figure 7:
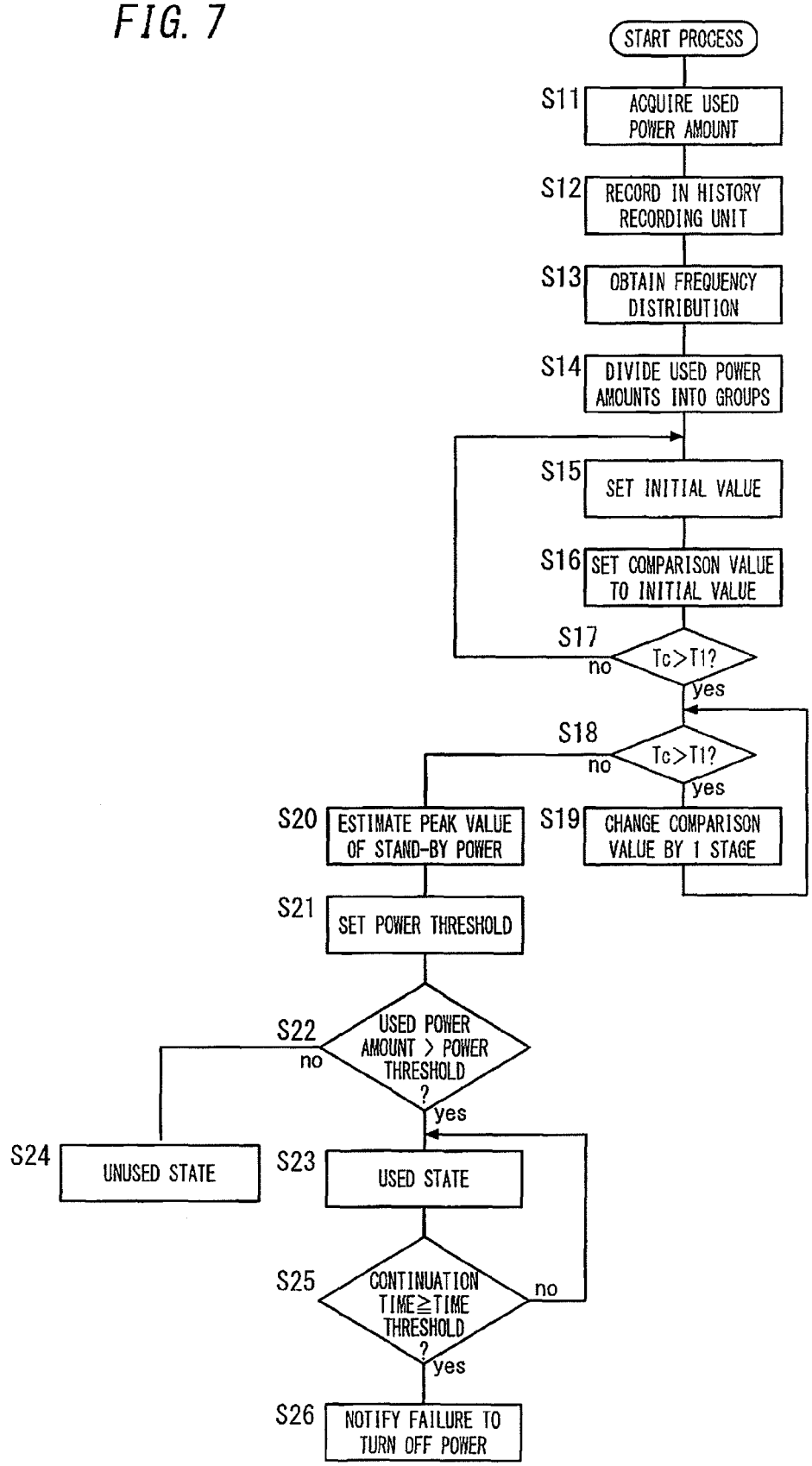
FIG. 7 is an operational explanatory diagram presenting an operation of the stand-by power estimating apparatus according to the embodiment as a flow chart.

The operations of the stand-by power estimating apparatus 10 described above are collectively shown in FIG. 7. The acquiring unit 11 acquires a used power amount measure by the measuring apparatus 20 for each branch line 3 (S11). The used power amount acquired by the acquiring unit 11 is associated with a date and time measured by the internal clock 13 and recorded in the history recording unit 12 (S12). Next, the statistical processing unit 143 provided in the determining unit 14 obtains a frequency distribution of the used power amount from history for the previous day recorded in the history recording unit 12 (S13). Once the frequency distribution is obtained, the division processing unit 144 divides a plurality of ranges having two or more consecutive sections with a plurality of used power amounts into a plurality of groups based on a shape of the frequency distribution (S14). The initial value setting unit 145 first obtains a maximum value of used power amounts from a group with a minimum used power amount among the plurality of groups and determines a value having a prescribed difference from the maximum value to be an initial value when obtaining stand-by power (S15).

The comparison value setting unit 141 sets a comparison value Vc to an initial value Vc0 (S16), and the power estimating unit 142 determines whether or not an amount of time Tc for which a used power amounts of the previous day as recorded in the history recording unit 12 is continuously equal to or lower than the comparison value Vc exceeds a sustained time T1 (S17). At this point, when the amount of time Tc is equal to or shorter than the sustained time T1 (S17: no), the initial value setting unit 145 changes the initial value Vc0 and the comparison value setting unit 141 resets the comparison value Vc (S15, S16). In step S17, when the amount of time Tc exceeds the sustained time T1 (S17: yes), until the amount of time Tc next decreases to or under the sustained time T1 (S18: no), the comparison value setting unit 141 changes the comparison value Vc by one stage (S19). In other words, steps S18 and S19 are repeated until the amount of time Tc decreases to or under the sustained time T1 (S18: no). The power estimating unit 142 estimates a comparison value Vc that is one stage prior to the comparison value Vc at which the amount of time Tc decreases to or under the sustained time T1 to be a peak value of stand-by power (S20). In other words, a minimum value Vc1 of the comparison value Vc is estimated to be a peak value of stand-by power in a range satisfying a condition that the amount of time Tc exceeds the sustained time T1.

The peak value of stand-by power estimated by the power estimating unit 142 is supplied to the threshold setting unit 146, and the threshold setting unit 146 sets a power threshold by adding a prescribed value to the peak value of stand-by power (S21). The state discriminating unit 147 compares the used power amount acquired by the acquiring unit 11 from the measuring apparatus 20 with the power threshold (S22). When the used power amount acquired from the measuring apparatus 20 exceeds the power threshold (S22: yes), the state discriminating unit 147 discriminates the electrical load 4 to be in a used state (S23). On the other hand, when the used power amount acquired from the measuring apparatus 20 is equal to or below the power threshold (S22: no), the state discriminating unit 147 discriminates the electrical load 4 to be in an unused state (S24).

Furthermore, the state discriminating unit 147 measures an amount of time for which a state of the electrical load 4 being discriminated to be in a used state continues and compares the amount of time of a continuous used state with a time threshold (S25). When the amount of time for which a used state continues reaches the time threshold (S25: yes), a determination of a failure to turn off power of the electrical load 4 is made and the failure to turn off power is notified to the information presenting apparatus 50 through the presentation control unit 15 (S26).

As described earlier, when a mobile terminal is used as the information presenting apparatus 50, a failure to turn off power of the electrical load 4 is notified to the information presenting apparatus 50 regardless of whether the user is in the residence of the consumer or at an outing destination. When the user realizes a failure to turn off power has occurred at the electrical load 4 through the information presenting apparatus 50, if a transition of a corresponding electrical load 4 can be made from the information presenting apparatus 50 to an unused state, the convenience of the user can be enhanced.

Figure 8:
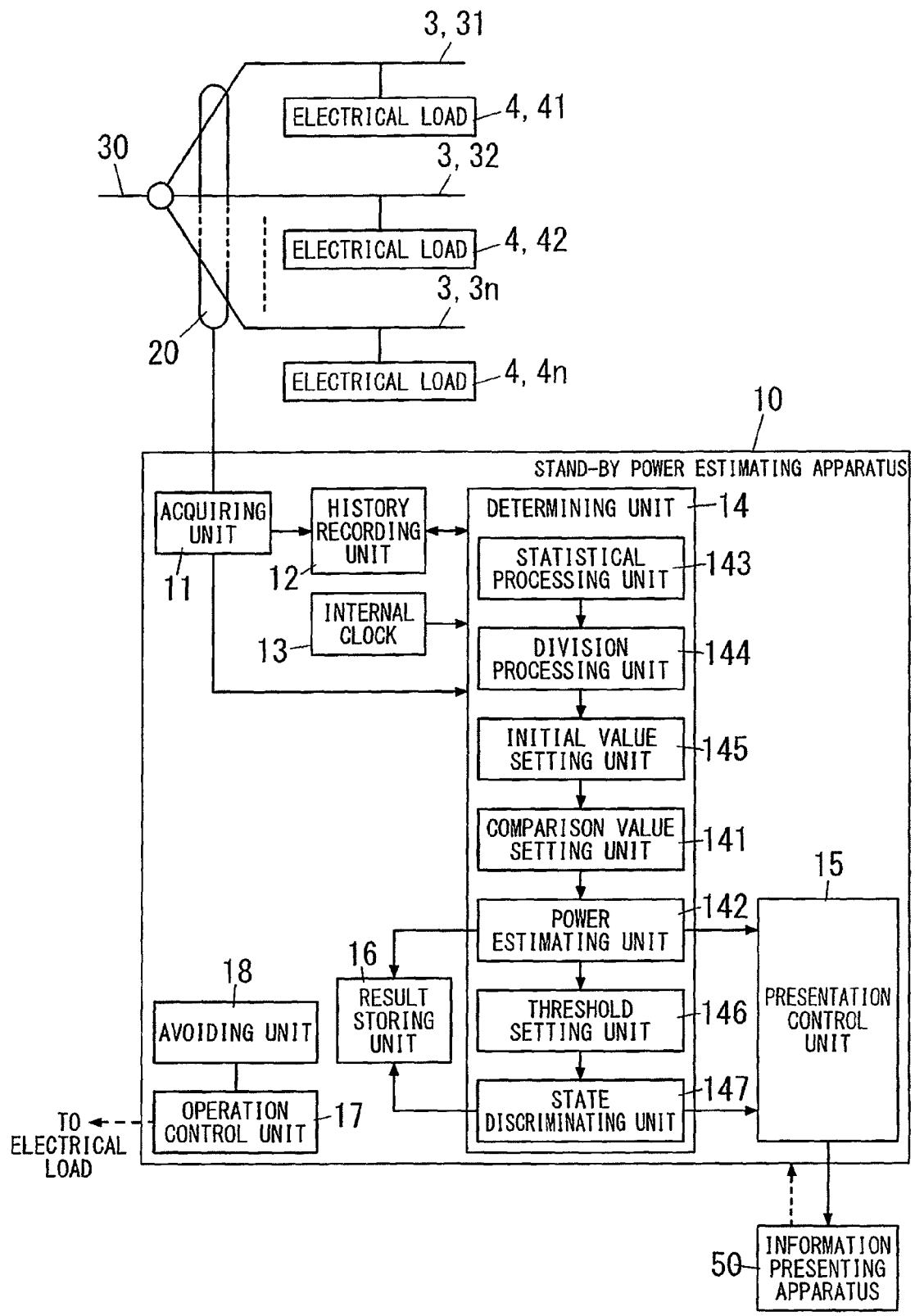
FIG. 8 is a block diagram showing a stand-by power estimating apparatus according to another embodiment.

To this end, in order to switch an electrical load 4 for which a failure to turn off power has been notified to the information presenting apparatus 50 to an unused state, an operation control unit 17 which controls the electrical load 4 to an unused state is added to the stand-by power estimating apparatus 10 as shown in FIG. 8. The operation control unit 17 may be provided so as to be built into a same chassis as the determining unit 14 or the like of the stand-by power estimating apparatus 10 or may be provided separately from the chassis of the stand-by power estimating apparatus 10.

When the electrical load 4 includes, for example, a JEMA (Japan Electrical Manufacturers' Association) standard HA terminal, the operation control unit 17 may be configured to supply the terminal with a signal for switching the electrical load 4 to an unused state. In addition, when the electrical load 4 has a function for communicating with an HEMS (Home Energy Management System) controller, an HEMS controller can be used as the operation control unit 17.

In order to issue an instruction for causing a transition of the electrical load 4 to an unused state to the operation control unit 17, the operation display apparatus provided in the information presenting apparatus 50 is used. In this case, when a failure to turn off power of the electrical load 4 is detected, as shown in FIG. 9A, the presentation control unit 15 desirably displays a "turn off all devices" button 52 and a "turn off devices individually" button 53 as operating units on the information presenting apparatus 50.

When the "turn off all devices" button 52 is pressed, an instruction is issued to the operation control unit 17 so as to cause a transition of all electrical loads 4 for which a failure to turn off power has been discriminated by the state discriminating unit 147 to an unused state. While the electrical loads 4 to collectively make a transition to an unused state may be all of the electrical loads 4 for which a failure to turn off power has been discriminated by the state discriminating unit 147, the electrical loads 4 may be those within a range registered by the user in the operation control unit 17 in advance. In addition, the operation control unit 17 may be configured so that time slots can be registered in the operation control unit 17 in addition to electrical loads 4. In this case, the operation control unit 17 collectively causes a transition of the registered electrical loads 4 to a non-operational state only when the time at which the "turn off all devices" button 52 is pressed is within a time slot registered in the operation control unit 17.

Figures 9A, 9B, 10:
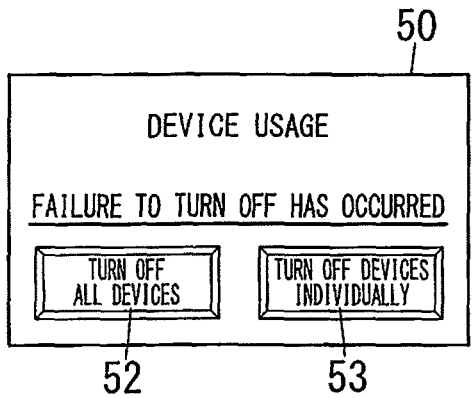
FIGS. 9A and 9B are diagrams showing an operation example of the configuration shown in FIG. 8.
FIG. 10 is a diagram showing another operation example of the configuration shown in FIG. 8.

When the "turn off devices individually" button 53 is pressed, the presentation control unit 15 displays a list associating electrical loads 4 with used power amounts on the operation display apparatus of the information presenting apparatus 50 as shown in FIG. 9B. In the list, the item of names of the electrical loads 4 doubles as a turn-off button 54 as an operating unit. When any of the turn-off buttons 54 is pressed, an instruction is issued to the operation control unit 17 so that a corresponding electrical load 4 makes a transition to an unused state.

As described above, since the information presenting apparatus 50 is provided with the "turn off all devices" button 52 and a "turn off devices individually" button 53, when a failure to turn off power of the electrical load 4 is detected, the electrical load 4 can be caused to make a transition to an unused state by operating the information presenting apparatus 50. In other words, even if the user is away from the electrical load 4, in addition to notifying an occurrence of a failure to turn off power of the electrical load 4, the electrical load 4 can be caused to make a transition to an unused state when necessary.

The operation control unit 17 may be configured so that a time at which the electrical load 4 is caused to make a transition to an unused state can be registered in the operation control unit 17. In other words, a configuration may be adopted which enables the user to register a time in the operation control unit 17 in advance, and when the registered time comes, the operation control unit 17 collectively causes all of the electrical loads 4 for which a failure to turn off power has been discriminated by the state discriminating unit 147 to make a transition to an unused state. Moreover, in a similar manner to operating the "turn off all devices" button 52, the electrical loads 4 to collectively make a transition to an unused state can be registered in the operation control unit 17 in advance and a time slot for causing a transition of the electrical loads 4 to an unused state may also be determined.

The stand-by power estimating apparatus 10 may be configured to cooperate with other apparatuses used by the power consumer. For example, in the case of a consumer having a security apparatus for purposes of crime prevention and disaster prevention, the user switches the security apparatus to a going-out mode (absence mode) or an alert mode when going out or retiring for the night. Therefore, a security apparatus of this type and the stand-by power estimating apparatus 10 may be linked so that a failure to turn off power of the electrical load 41 is discriminated when a transition is made to the going-out mode or the alert mode. By linking the stand-by power estimating apparatus 10 with a security apparatus in this manner, whether or not a failure to turn off power of the electrical loads 4 has occurred is automatically confirmed when going out or retiring for the night.

When an occurrence of a failure to turn off power of the electrical loads 4 is automatically confirmed by linking to a security apparatus, whether the failure is to be notified to the information presenting apparatus 50 or a transition of a corresponding electrical load 4 is to be automatically made to an unused state may be selected by the user by issuing an instruction to the stand-by power estimating apparatus 10.

When a configuration is adopted in which the stand-by power estimating apparatus 10 is linked with a security apparatus and a failure to turn off power of the electrical loads 4 is discriminated upon making a transition to the going-out mode or the alert mode, whether or not a failure to turn off power of the electrical loads 4 has occurred can be confirmed at a desired timing such as upon going out or retiring for the night. In other words, the trouble of operating the stand-by power estimating apparatus 10 can be eliminated and a confirmation regarding a failure to turn off power of the electrical loads 4 can be reliably performed without forgetting to do so.

In the configuration example described above, when a failure to turn off power of the electrical loads 4 is notified to the information presenting apparatus 50, an operation for causing a transition of electrical loads 4 registered in advance in the operation control unit 17 is enabled. In contrast to this configuration, a configuration may be adopted in which electrical loads 4 that are prevented from making a transition to a non-operational state are registered in advance in an avoiding unit 18, whereby an instruction to cause a transition to an unused state is not issued to the operation control unit 17 with respect to electrical loads 4 registered in the avoiding unit 18.

For example, electrical loads 4 that substantially require a used state to be constantly continued and electrical loads 4 that require a used state to be continued once activated may be registered in the avoiding unit 18. A representative example of the former electrical load 4 is a refrigerator, and examples of the latter electrical load 4 include a recorder that records video or audio (such as a hard disk recorder), a washing machine, and a dishwasher.

The user is to register desired electrical loads 4 in the avoiding unit 18 or use the names of electrical loads 4 to automatically register desired electrical loads 4 in the avoiding unit 18. The avoiding unit 18 is configured so that, even if the state discriminating unit 147 discriminates that a failure to turn off power of a registered electrical load 4 has occurred, an instruction to cause a transition of the electrical load 4 to an unused state is not issued from the information presenting apparatus 50 to the operation control unit 17.

For example, information to be presented by the presentation control unit 15 to the operation display apparatus of the information presenting apparatus 50 may be changed according to information regarding electrical loads 4 registered in the avoiding unit 18. In this case, when the presentation control unit 15 presents electrical loads 4 for which the state discriminating unit 147 has discriminated that a failure to turn off power of has occurred as a list to the information presenting apparatus 50, a turn-off button 54 is not displayed for electrical loads 4 registered in the avoiding unit 18. In other words, the electrical loads 4 registered in the avoiding unit 18 are only presented to the information presenting apparatus 50 when in a used state and an operation for causing a transition to an unused state is disabled. In the illustrated example, a transition to an unused state is disabled for a "washing machine" and a "refrigerator". Therefore, a turn-off button 54 is not displayed for these electrical loads 4.

Alternatively, a turn-off button 54 may also be displayed on the information presenting apparatus 50 for electrical loads 4 registered in the avoiding unit 18 and operations of the turn-off button 54 may be disabled.

As described above, since an electrical load 4 registered in the avoiding unit 18 cannot make a transition to an unused state even when the state discriminating unit 147 has discriminated that a failure to turn off power of the electrical load 4 of has occurred, a situation where the user causes a transition of the electrical load 4 to an unused state by mistake can be prevented.

(Advantageous Effect of the Embodiment)

The stand-by power estimating apparatus 10 according to the present embodiment compares a plurality of used power amounts recorded in the history recording unit 12 with a variably set comparison value Vc, obtains a minimum value of the comparison value Vc under a condition that an amount of time for which some of the used power amounts are equal to or smaller than the comparison value Vc exceeds a sustained time T1, and estimates the value to be a peak value of stand-by power. Therefore, a peak value of stand-by power is objectively obtained according to a formulated procedure, and even when stand-by power fluctuates according to time slots and cannot be accurately obtained even by evaluating frequencies of used power amounts, stand-by power can be accurately obtained. In addition, since time information is not lost as in the case of obtaining stand-by power using a frequency distribution, even in a case of using a plurality of electrical loads 4 for which a used state and an unused state coexist in a frequency distribution, the stand-by power can be separated and obtained.

Furthermore, since a minimum value of a comparison value is set using a frequency of a used power amount, the minimum value of the comparison value can be promptly obtained without having to perform unnecessary processes.

As described above, since a peak value of stand-by power is accurately obtained, by using the peak value of stand-by power as a reference, a power threshold for discriminating between a used state and an unused state of an electrical load 4 can be determined with accuracy. In addition, using the power threshold, whether or not an electrical load 4 is in a used state can be accurately discriminated.

In addition, since a failure to turn off power is determined when a used state of an electrical load 4 continues until a time threshold that is scheduled as an amount of time for which the electrical load 4 is continuously used, a failure to turn off power can be detected with accuracy.

When a failure to turn off power of an electrical load 4 is detected, since the stand-by power estimating apparatus 10 notifies the failure to turn off power to the information presenting apparatus 50, the failure to turn off power of the electrical load 4 can be notified to a user through the information presenting apparatus 50. In addition, since a failure to turn off power of an electrical load 4 can be notified for each segment (in the embodiment, the branch line 3) of the power distribution network, which segment includes the electrical load 4 for which the failure to turn off power had occurred can be readily confirmed. In particular, when the information presenting apparatus 50 is a mobile terminal, a failure to turn off power of an electrical load 4 can be recognized regardless of the location of the information presenting apparatus 50.

Furthermore, when a result storing unit 16 which stores a result obtained from the determining unit 14 is provided, a result obtained from the determining unit 14 can be recorded and an evaluation can be performed at a later date.

The stand-by power estimating apparatus 10 according to the present embodiment includes an acquiring unit 11, a history recording unit 12, and the determining unit 14. The acquiring unit 11 is configured to acquire power amounts for respective prescribed measurement times as a plurality of used power amounts, from a measuring apparatus 20. The measuring apparatus 20 measures power of a segment (a branch line 3) set in a power distribution network of a power consumer. The history recording unit 12 is configured to record each of the plurality of used power amounts of the segment in association with a date and time of acquisition by the acquiring unit 11. The determining unit 14 has first to third functions described below. The first function is for variably setting a comparison value for comparing magnitudes of the plurality of used power amounts recorded in the history recording unit 12. The second function is for obtaining a minimum value of the comparison value in, within a range in which the comparison value is variable, a range satisfying a condition that an amount of time for which, in a state where the plurality of used power amounts are arranged in order of the measurement times, at least some of the plurality of used power amounts are continuously equal to or below the comparison value exceeds a prescribed sustained time. The third function is for estimating the minimum value to be a peak value of the stand-by power of the segment.

As in the case of the stand-by power estimating apparatus 10 according to the present embodiment, favorably, the determining unit 14 further has fourth to seventh functions described below. The fourth function is for obtaining a frequency distribution with respect to the plurality of used power amounts recorded in the history recording unit 12. The fifth function is for grouping a plurality of ranges having two or more consecutive sections in which the frequency exceeds a prescribed frequency threshold in the frequency distribution into a plurality of groups G1 and G2 regarding the plurality of used power amounts. The sixth function is for selecting, as an initial value of the comparison value, a value satisfying the condition among values that are set based on a maximum value among the plurality of used power amounts obtained for each of the plurality of groups G1 and G2. The seventh function is a function for monotonously varying the comparison value from the initial value to the maximum value in a group used to determine the initial value among the plurality of groups G1 and G2.

As in the case of the stand-by power estimating apparatus 10 according to the present embodiment, favorably, the determining unit 14 uses two or more used power amounts in a prescribed determination period among the plurality of used power amounts recorded in the history recording unit 12.

As in the case of the stand-by power estimating apparatus 10 according to the present embodiment, favorably, the determining unit 14 further has a function for setting a power threshold for discriminating an operational state of an electrical load 4 included in the segment of the power distribution network using the estimated peak value.

As in the case of the present embodiment, favorably, the stand-by power estimating apparatus 10 further includes a state discriminating unit 147. The state discriminating unit 147 is configured to discriminate an operational state of the electrical load 4 in the segment of the power distribution network by comparing the plurality of used power amounts acquired by the acquiring unit 11 from the measuring apparatus 20 and the power threshold set by the determining unit 14.

As in the case of the stand-by power estimating apparatus 10 according to the present embodiment, favorably, the state discriminating unit 147 further has a function for measuring an amount of time for which a use state of the electrical load 4 in the segment continues, and estimating that a failure to turn off the electrical load 4 has occurred in the segment when the amount of time reaches a prescribed time threshold.

As in the case of the present embodiment, favorably, the stand-by power estimating apparatus 10 further includes a presentation control unit 15 configured to notify an information presenting apparatus 50 of a discrimination result obtained by the state discriminating unit 147.

As in the case of the present embodiment, favorably, the information presenting apparatus 50 is a mobile terminal used by a user belonging to the consumer, and the presentation control unit 15 is configured to notify the information presenting apparatus 50 of a discrimination result when the state discriminating unit 147 discriminates that the electrical load 4 in the segment in the power distribution network is in a used state.

As in the case of the stand-by power estimating apparatus 10 according to the present embodiment, favorably, the presentation control unit 15 has a function for selecting a format used to present a discrimination result obtained by the state discriminating unit 147 to the information presenting apparatus 50 from a plurality of formats.

As in the case of the present embodiment, favorably, the stand-by power estimating apparatus 10 further includes an operation control unit 17 configured to control the electrical load 4 to an unused state. In this case, the information presenting apparatus 50 includes an operating unit for issuing an instruction to the operation control unit 17 to cause a transition of the electrical load 4 discriminated to be in a used state by the state discriminating unit 147, to an unused state.

As in the case of the present embodiment, favorably, the stand-by power estimating apparatus 10 further includes an avoiding unit 18. The avoiding unit 18 is configured to prevent an instruction to cause a transition to an unused state to be issued from the operating unit to the operation control unit 17 with respect to the electrical load 4 which is discriminated to be in a used state by the state discriminating unit 147 and which is prohibited from making a transition to an unused state.

As in the case of the present embodiment, favorably, the stand-by power estimating apparatus 10 further includes a presentation control unit 15 configured to notify an information presenting apparatus 50 that is a mobile terminal used by a user belonging to the consumer, of a discrimination result obtained by the state discriminating unit 147. When the state discriminating unit 147 estimates that a failure to turn off the electrical load 4 has occurred in the segment in the power distribution network, the presentation control unit 15 is configured to notify the information presenting apparatus 50 of this estimation result.

As in the case of the present embodiment, favorably, the stand-by power estimating apparatus 10 further includes a result storing unit 16 configured to store a history of results obtained by the determining unit 14.

As in the case of the present embodiment, favorably, the segment is set in plurality in the power distribution network. In this case, the acquiring unit 11 is configured to acquire a plurality of used power amounts from the measuring apparatus 20 for each of the plurality of segments. The history recording unit 12 is configured to record each of the plurality of used power amounts in association with a date and time of acquisition by the acquiring unit 11 for each of the plurality of segments. The determining unit 14 is configured to obtain the minimum value for each of the plurality of segments and estimates the minimum value to be the peak value.

A program according to the present embodiment causes a computer to function as the stand-by power estimating apparatus 10 according to the present embodiment.

The embodiment described above merely represents an example of the present invention. Therefore, it is to be understood that the present invention is not limited to the embodiment described above and various modifications can be made to the present invention besides the embodiment in accordance with designs and the like without deviating from the technical ideas of the invention.

The invention claimed is:

1. A stand-by power estimating apparatus comprising:
an acquiring unit configured to acquire power amounts for respective prescribed measurement times from a measuring apparatus that measures power of at least one segment set in a power distribution network of a power consumer, as a plurality of used power amounts;
a history recording unit configured to record each of the plurality of used power amounts of the at least one segment in association with a date and time of acquisition by the acquiring unit; and
a determining unit which has a function for variably setting a comparison value for comparing magnitudes of the plurality of used power amounts recorded in the history recording unit, a function for obtaining a minimum value of the comparison value in, within a range in which the comparison value is variable, a range satisfying a condition that an amount of time for which, in a state where the plurality of used power amounts are arranged in order of the measurement times, at least some of the plurality of used power amounts are continuously equal to or below the comparison value exceeds a prescribed sustained time, and a function for estimating the minimum value to be a peak value of stand-by power of the at least one segment.

2. The stand-by power estimating apparatus according to claim 1,
wherein the determining unit further has:
a function for obtaining a frequency distribution with respect to the plurality of used power amounts recorded in the history recording unit;
a function for grouping a plurality of ranges having two or more consecutive sections in which the frequency exceeds a prescribed frequency threshold in the frequency distribution into a plurality of groups regarding the plurality of used power amounts;
a function for selecting, as an initial value of the comparison value, a value satisfying the condition among values that are set based on a maximum value among the plurality of used power amounts obtained for each of the plurality of groups; and
a function for monotonously varying the comparison value from the initial value to the maximum value in a group used to determine the initial value among the plurality of groups.

3. The stand-by power estimating apparatus according to claim 1, wherein the determining unit uses two or more used power amounts in a prescribed determination period among the plurality of used power amounts recorded in the history recording unit.

4. The stand-by power estimating apparatus according to claim 1, wherein the determining unit further has a function for setting a power threshold for discriminating an operational state of an electrical load included in the at least one segment of the power distribution network using the estimated peak value.

5. The stand-by power estimating apparatus according to claim 4, further comprising a state discriminating unit configured to discriminate the operational state of the electrical load in the at least one segment of the power distribution network by comparing the plurality of used power amounts acquired by the acquiring unit from the measuring apparatus and the power threshold set by the determining unit.

6. The stand-by power estimating apparatus according to claim 5, wherein the state discriminating unit further has a function for measuring an amount of time for which a use state of the electrical load in the at least one segment continues, and estimating that a failure to turn off the electrical load has occurred in the at least one segment when the amount of time reaches a prescribed time threshold.

7. The stand-by power estimating apparatus according to claim 5, further comprising a presentation control unit configured to notify an information presenting apparatus of a discrimination result obtained by the state discriminating unit.

8. The stand-by power estimating apparatus according to claim 7,
wherein the information presenting apparatus is a mobile terminal used by a user belonging to the consumer, and
wherein when the state discriminating unit discriminates that the electrical load in the at least one segment in the power distribution network is in a used state, the presentation control unit is configured to notify the information presenting apparatus of the discrimination result.

9. The stand-by power estimating apparatus according to claim 8, wherein the presentation control unit has a function for selecting a format in which the discrimination result obtained by the state discriminating unit is presented to the information presenting apparatus from a plurality of formats.

10. The stand-by power estimating apparatus according to claim 7, further comprising an operation control unit configured to control the electrical load to an unused state,
wherein the information presenting apparatus comprises an operating unit for issuing an instruction to the operation control unit to cause a transition of the electrical load discriminated to be in a used state by the state discriminating unit, to the unused state.

11. The stand-by power estimating apparatus according to claim 10, further comprising an avoiding unit configured to prevent the instruction to cause the transition to the unused state to be issued from the operating unit to the operation control unit with respect to the electrical load which is discriminated to be in the used state by the state discriminating unit and which is prohibited from making the transition to the unused state.

12. The stand-by power estimating apparatus according to claim 6, further comprising a presentation control unit configured to notify an information presenting apparatus that is a mobile terminal used by a user belonging to the consumer, of a discrimination result obtained by the state discriminating unit,
wherein when the state discriminating unit estimates that the failure to turn off the electrical load has occurred in the at least one segment in the power distribution network, the presentation control unit is configured to notify the information presenting apparatus of this estimation result.

13. The stand-by power estimating apparatus according to claim 1, further comprising a result storing unit configured to store a history of results obtained by the determining unit.

14. The stand-by power estimating apparatus according to claim 1,
wherein the at least one segment comprises a plurality of segments set in the power distribution network,
wherein the acquiring unit is configured to acquire the plurality of used power amounts from the measuring apparatus for each of the plurality of segments,
wherein the history recording unit is configured to record each of the plurality of used power amounts in association with the date and time of acquisition by the acquiring unit, for each of the plurality of segments, and wherein the determining unit is configured to obtain the minimum value for each of the plurality of segments and estimates the minimum value to be the peak value.

15. A non-transitory computer-readable storage medium on which a program is recorded, the program causing a computer to function as a stand-by power estimating apparatus, the stand-by power estimating apparatus comprising:

an acquiring unit configured to acquire power amounts for respective prescribed measurement times from a measuring apparatus that measures power of at least one segment set in a power distribution network of a power consumer, as a plurality of used power amounts;

a history recording unit configured to record each of the plurality of used power amounts of the at least one segment in association with a date and time of acquisition by the acquiring unit; and a determining unit which has a function for variably setting a comparison value for comparing magnitudes of the plurality of used power amounts recorded in the history recording unit, a function for obtaining a minimum value of the comparison value in, within a range in which the comparison value is variable, a range satisfying a condition that an amount of time for which, in a state where the plurality of used power amounts are arranged in order of the measurement times, at least some of the plurality of used power amounts are continuously equal to or below the comparison value exceeds a prescribed sustained time, and a function for estimating the minimum value to be a peak value of stand-by power of the at least one segment.

16. The stand-by power estimating apparatus according to claim 2, wherein the determining unit uses two or more used power amounts in a prescribed determination period among the plurality of used power amounts recorded in the history recording unit.

17. The stand-by power estimating apparatus according to claim 2, wherein the determining unit further has a function for setting a power threshold for discriminating an operational state of an electrical load included in the at least one segment of the power distribution network using the estimated peak value.

18. The stand-by power estimating apparatus according to claim 6, further comprising a presentation control unit configured to notify an information presenting apparatus of a discrimination result obtained by the state discriminating unit.

19. The stand-by power estimating apparatus according to claim 2, further comprising a result storing unit configured to store a history of results obtained by the determining unit.

20. The stand-by power estimating apparatus according to claim 2, wherein the at least one segment comprises a plurality of segments set in the power distribution network, wherein the acquiring unit is configured to acquire the plurality of used power amounts from the measuring apparatus for each of the plurality of segments, wherein the history recording unit is configured to record each of the plurality of used power amounts in association with the date and time of acquisition by the acquiring unit, for each of the plurality of segments, and wherein the determining unit is configured to obtain the minimum value for each of the plurality of segments and estimates the minimum value to be the peak value.

* * * * *